United States Patent
Ho et al.

(10) Patent No.: US 6,836,811 B2
(45) Date of Patent: Dec. 28, 2004

(54) FRONT ACCESS ONLY CPCI COMPUTER SYSTEM

(75) Inventors: Raymond K. Ho, San Jose, CA (US); Richard R. Creason, Palo Alto, CA (US); Kaamel M. Kermaani, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 457 days.

(21) Appl. No.: 09/953,503

(22) Filed: Sep. 12, 2001

(65) Prior Publication Data

US 2003/0051088 A1 Mar. 13, 2003

(51) Int. Cl.[7] .................. H05K 7/10; H01R 12/16

(52) U.S. Cl. .................. 710/301; 710/105; 361/788

(58) Field of Search .................. 710/105, 300, 710/301, 302, 306, 307, 313, 314; 206/706, 707; 211/41.17; 312/223.1, 223.2; 361/752, 753, 788, 796, 803; 439/61, 78, 82; 174/262

(56) References Cited

U.S. PATENT DOCUMENTS

| | | | | |
|---|---|---|---|---|
| 4,511,950 A | * | 4/1985 | Bunner et al. | 361/788 |
| 6,128,196 A | * | 10/2000 | Hoyle et al. | 361/752 |
| 6,356,966 B1 | * | 3/2002 | Loach et al. | 439/78 |
| 6,456,498 B1 | * | 9/2002 | Larson et al. | 361/752 |
| 6,526,465 B1 | * | 2/2003 | Voth et al. | 710/301 |
| 6,578,103 B1 | * | 6/2003 | Hill et al. | 710/313 |
| 6,646,868 B2 | * | 11/2003 | Ho et al. | 361/684 |

* cited by examiner

*Primary Examiner*—Khanh Dang
(74) *Attorney, Agent, or Firm*—Meyertons Hood Kivlin Kowert & Goetzel, P.C.; B. Noël Kivlin

(57) ABSTRACT

A system and apparatus for a compact peripheral component interconnect (CPCI) computer system having exclusive front card access for both active and passive CPCI cards is provided. This system is further comprised of an active backplane with a front and rear side, a plurality of slots, each of these slots comprising of at least one connector and each of these connectors having a column and row arrangement of connector-pins, wherein individual ones of these connector-pins correspond to selected pairs of adjacent slots, and wherein selected adjacent slot pairs are reserved for particular pairs of CPCI cards comprising a single active card and a single passive card.

18 Claims, 6 Drawing Sheets

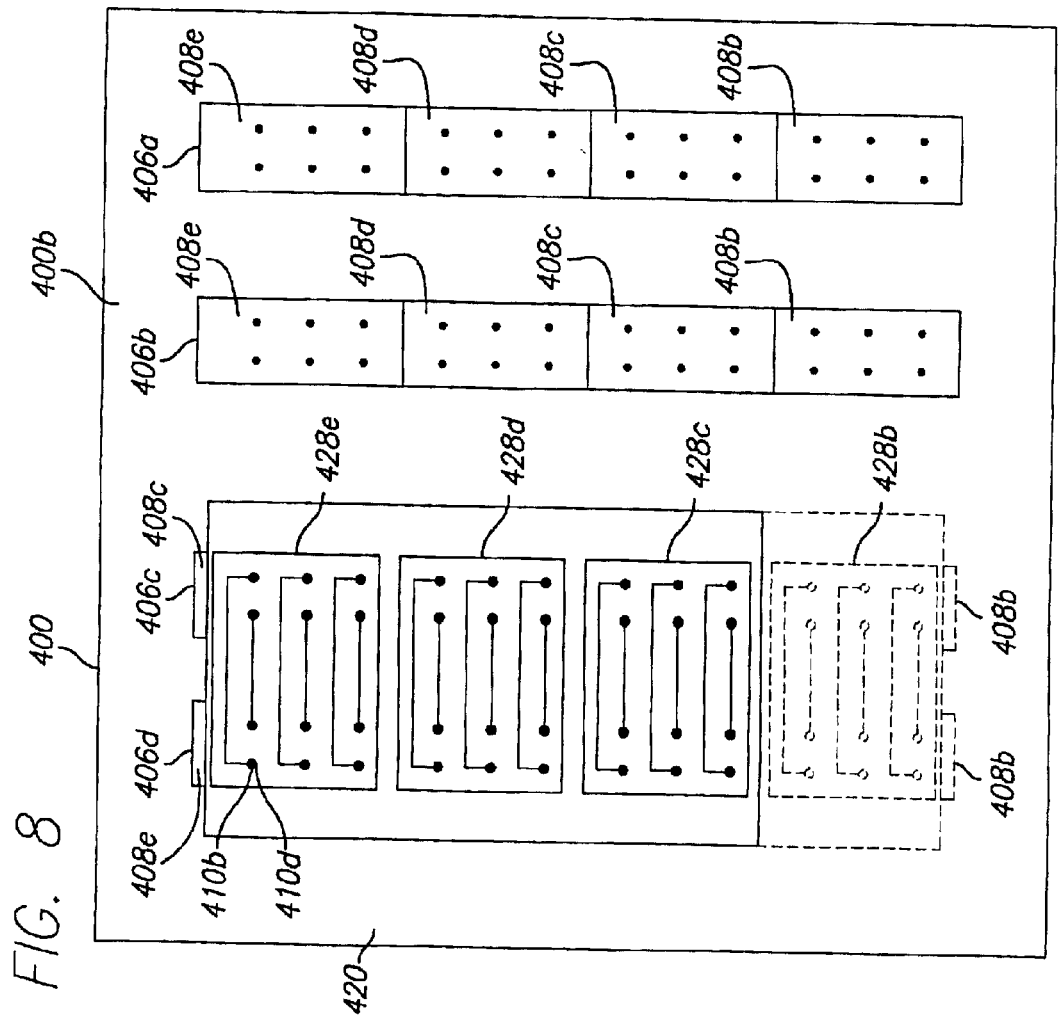
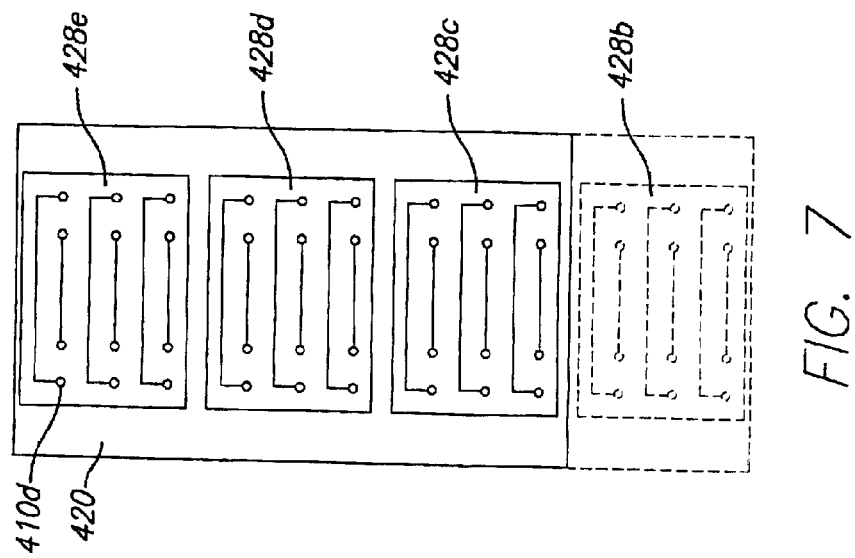

FRONT ACCESS ONLY CPCI COMPUTER SYSTEM

BACKGROUND OF THE INVENTION

1. Field of the Invention

The present invention relates to Compact Peripheral Component Interconnect ("CPCI") computer systems. More particularly, the present invention relates to a method and apparatus for providing a CPCI computer system in which front side access is provided for both active and passive CPCI cards.

2. Description of Related Art

CPCI is a high performance industrial bus based on the standard PCI electrical specification in rugged 3U or 6U Eurocard packaging. CPCI is intended for application in telecommunications, computer telephony, real-time machine control, industrial automation, real-time data acquisition, instrumentation, military systems or any other application requiring high speed computing, modular and robust packaging design, and long term manufacturer support. Because of its extremely high speed and bandwidth, the CPCI bus is particularly well suited for many high-speed data communication applications such as servers, routers, converters, and switches.

Compared to standard desktop PCI, CPCI supports twice as many PCI slots (8 versus 4) and offers a packaging scheme that is much better suited for use in industrial applications. Conventional CPCI cards are designed for front loading and removal from a card cage. The cards are firmly held in position by their connector, card guides on both sides, and a faceplate that solidly screws into the card cage. Cards are mounted vertically allowing for natural or forced air convection for cooling. Also, the pin-and-socket connector of the CPCI card is significantly more reliable and has better shock and vibration characteristics than the card edge connector of the standard PCI cards.

Conventional CPCI defines a backplane environment that is limited to eight slots.

More specifically, the bus segment of the conventional CPCI system is limited to eight slots, which includes a system slot and peripheral slots. According to conventional standards, the system slot provides clocking, arbitration, configuration, and interrupt processing for up to seven peripheral slots.

Conventional CPCI systems are further defined by the insertion of front side "active" daughter cards ("front cards") comprising various signals that "pass-through" relevant interconnect signals and mate with rear side "passive" input/output (I/O) card(s) ("rear transition cards"). As is commonly practiced in the art, rear transition cards are designed to require minimal maintenance relative to front active cards. Consequently, it has also become common practice to physically place the front of these backplanes in a location relatively more accessible than the rear of the backplane (e.g., having the rear side of the backplane facing a wall as opposed to the front side). In several applications (e.g., telephony technology), however, CPCI systems are rapidly increasing in size and complexity. As a result, conventional CPCI architecture has become increasingly problematic whenever rear transition cards require maintenance or replacement in these types of applications.

Accordingly, there is a need in the art for a CPCI computer system designed to provide improved accessibility to passive transition cards. In particular, it would be advantageous to provide a CPCI computer system in which front side access is provided for both active and passive CPCI cards.

SUMMARY OF THE INVENTION

The present invention relates to a system and apparatus for providing a compact peripheral component interconnect (CPCI) computer system with exclusive front card access for both active and passive CPCI cards. This system is further comprised of an active backplane with a front and rear side, a plurality of slots each comprising of at least one connector and each of these connectors having a column and row arrangement of connector-pins, wherein individual ones of these connector-pins correspond to selected pairs of adjacent slots, and wherein selected adjacent slot pairs are reserved for particular pairs of CPCI cards comprising a single active card and a single passive card, an active card and its corresponding passive card.

A more complete understanding of the front access only CPCI computer system will be afforded to those skilled in the art, as well as a realization of additional advantages and objects thereof, by a consideration of the following detailed description of the preferred embodiment. Reference will be made to the appended sheets of drawings which will first be described briefly.

BRIEF DESCRIPTION OF THE DRAWINGS

FIG. 7 is a schematic of a shunt card according to an alternative embodiment of the invention; and FIG. 8 shows an exemplary implementation of a shunt card according to an alternative embodiment of the invention.

DETAILED DESCRIPTION OF THE PREFERRED EMBODIMENT

In conventional CPCI system architecture, passive transition cards are inserted from the rear where accessibility is limited. Accordingly, there is a need for a CPCI system where these transition cards may be easily accessed whenever maintenance or replacement is required. The present invention addresses this need by providing a CPCI computer system that is adapted to provide front side access for both active and passive CPCI cards. In the detailed description that follows, like element numerals are used to describe like elements shown in one or more of the drawings.

Figure 1:
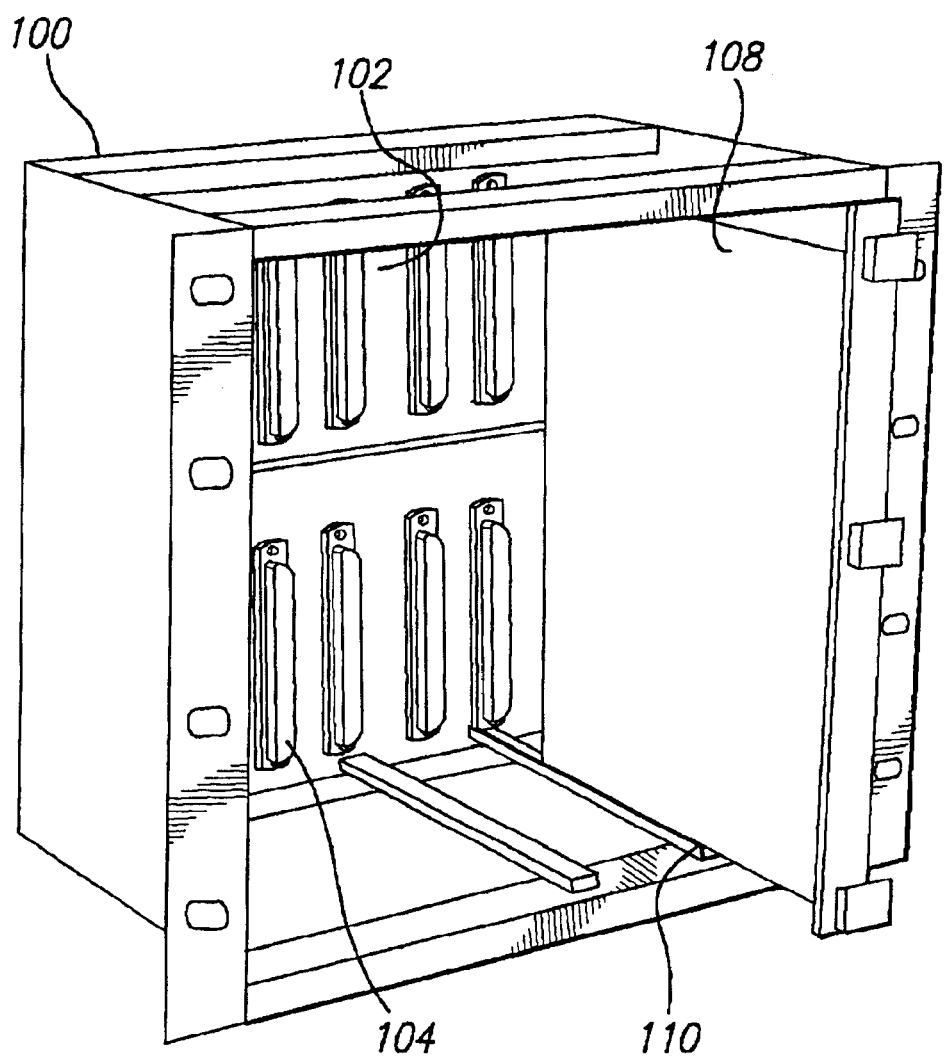
FIG. 1 is a perspective view of a conventional CPCI chassis system.

Referring to FIG. 1, there is shown a perspective view of a conventional CPCI chassis system. The chassis system 100 includes a CPCI circuit board referred to in the conventional CPCI system as a passive backplane 102. The passive backplane 102 derives its name from the fact that it is located at the back of the chassis 100 and add-on cards (front cards) can only be inserted from the front of the chassis 100. On the front side of the backplane 102 are slots provided with connectors 104. In the conventional chassis system 100 that is shown, a 6U daughter card 108 is inserted into one of the slots and mates with a corresponding one of the connectors 104. For proper insertion of the daughter cards 108 into the slots, card guides 110 are provided. This conventional chassis system 100 provides front removable daughter cards and unobstructed cooling across the entire set of daughter cards 108.

Figure 2:
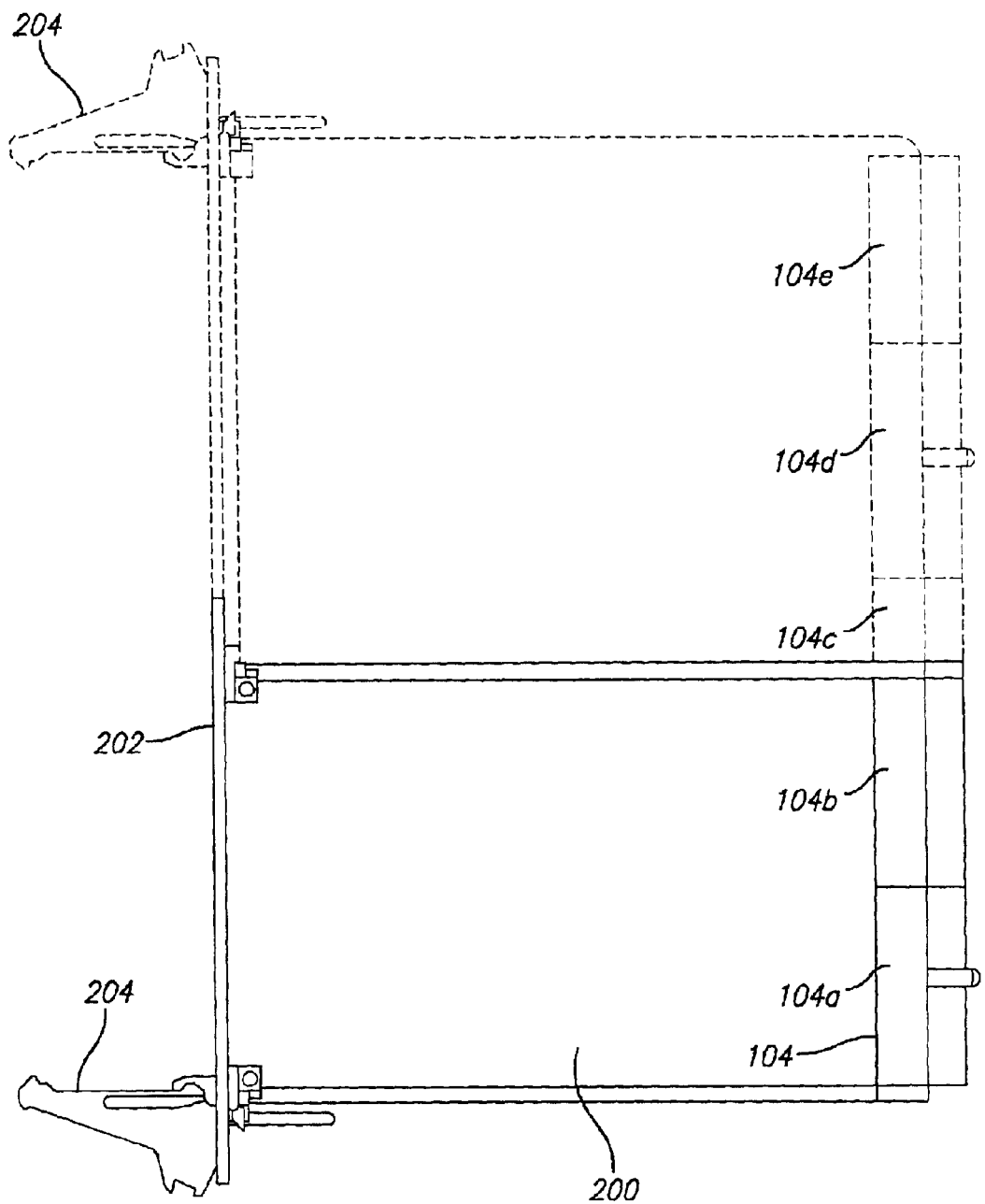
FIG. 2 shows the form factor that is defined for the CPCI daughter card.

Referring to FIG. 2, there is shown the form factor defined for the CPCI daughter card, which is based on the Eurocard industry standard. As shown in FIG. 2, the daughter card 200 has a front plate interface 202 and ejector/injector handles 204. The front plate interface 202 is consistent with Eurocard packaging and is compliant with IEEE 1101.1 or IEEE 1101.10. The ejector/injector handles should also be compliant with IEEE 1101.1. One ejector/injector handle 204 is used for 3U daughter cards, and two ejector/injector handles 204 are used for 6U daughter cards. The connectors 104a–104e of the daughter card 200 are numbered starting from the bottom connector 104a, and both 3U and 6U daughter card sizes are defined, as described below.

The dimensions of the 3U form factor are approximately 160.00 mm by approximately 100.00 mm, and the dimensions of the 6U form factor are approximately 160.00 mm by approximately 233.35 mm. The 3U form factor includes two 2 mm connectors 104a–104b, which is the minimum number of connectors that are required to accommodate a full 64-bit CPCI bus. Specifically, the 104a connectors are reserved to carry the signals required to support the 32-bit PCI bus, hence no other signals may be carried in any of the pins of this connector. Optionally, the 104a connectors may have a reserved key area that can be provided with a connector "key", which is a pluggable plastic piece that comes in different shapes and sizes, so that the add-on card can only mate with an appropriately keyed slot. The 104b connectors are defined to facilitate 64-bit transfers or for rear panel I/O in the 3U form factor. The 104c–104e connectors are available for 6U systems as shown in FIG. 1. The 6U form factor includes the two connectors 104a–104b of the 3U form factor, and three additional 2 mm connectors 104c–104e. In other words, the 3U form factor includes connectors 104a–104b, and the 6U form factor includes connectors 104a–104e. The three additional connectors 104c–104e of the 6U form factor can be used for secondary buses (e.g., Signal Computing System Architecture (SCSA) or MultiVendor Integration Protocol (MVIP) telephony buses), bridges to other buses (e.g., Virtual Machine Environment (VME) or Small Computer System Interface (SCSI)), or for user specific applications. Note that the CPCI specification defines the locations for all the connectors 104a–104e, but only the signal-pin assignments for the CPCI bus portion 104a and 104b are defined. The remaining connectors are the subjects of additional specification efforts, or can be user defined for specific applications, as described above.

Figure 3:
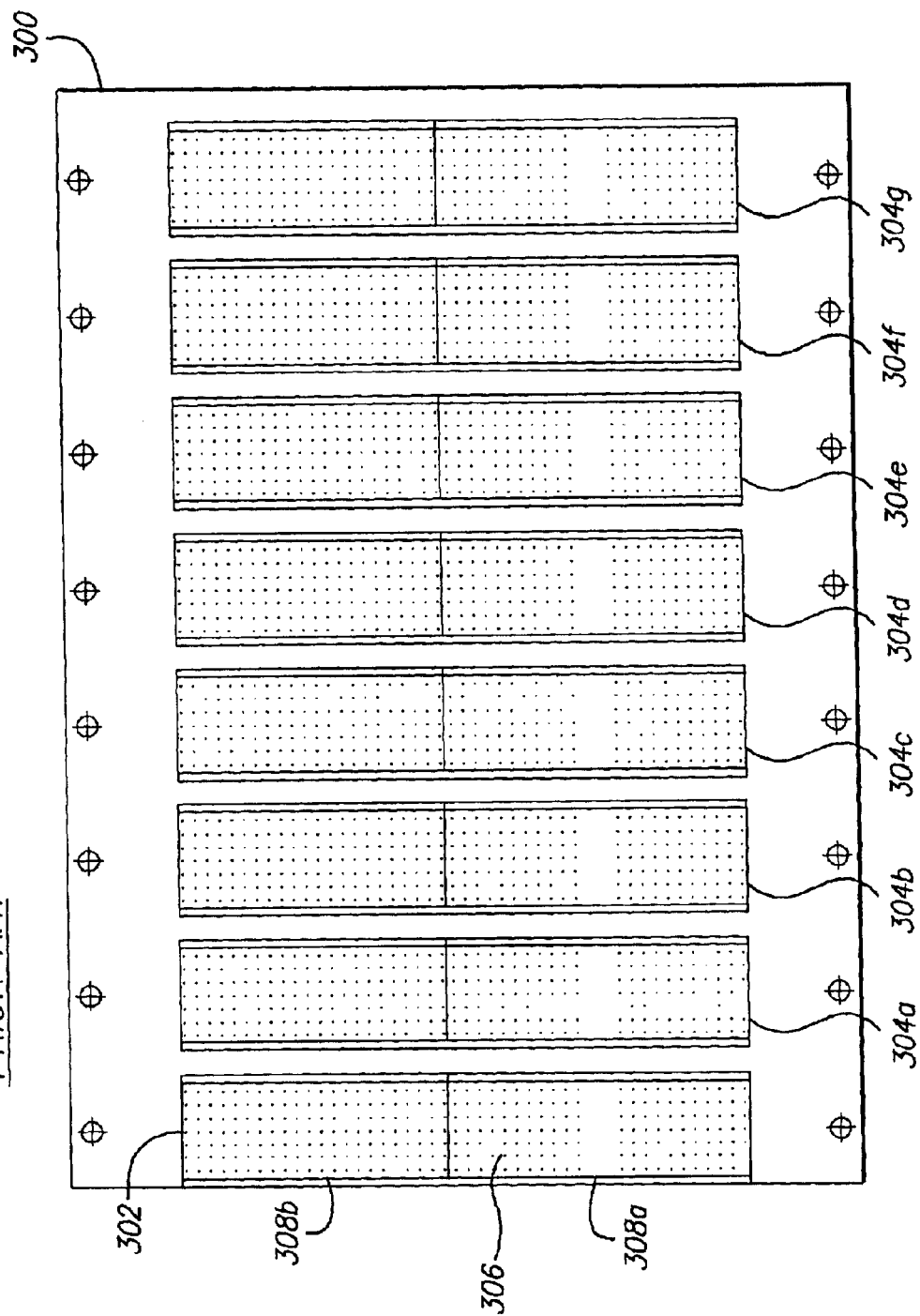
FIG. 3 is a front view of a conventional 3U backplane having eight slots with two connectors each.

Referring to FIG. 3, there is shown a front view of a conventional 3U backplane having eight slots with two connectors each. A CPCI system is composed of one or more CPCI bus segments, where each bus segment includes up to eight CPCI card slots. Each CPCI bus segment includes one system slot 302, and up to seven peripheral slots 304a–304g. The CPCI daughter card for the system slot 302 provides arbitration, clock distribution, and reset functions for the CPCI peripheral cards on the bus segment. The peripheral slots 304a–304g may contain simple cards, intelligent slaves or PCI bus masters.

The connectors 308a, 308b have connector-pins 306 that project in a direction perpendicular to the backplane 300, and are designed to mate with the front side "active" daughter cards ("front cards"), and "pass-through" its relevant interconnect signals to mate with the rear side "passive" input/output (I/O) card(s) ("rear transition cards"). In other words, in the conventional CPCI system, the connector-pins 306 allow the interconnected signals to pass-through from the front cards to the rear transition cards.

Figure 4B:
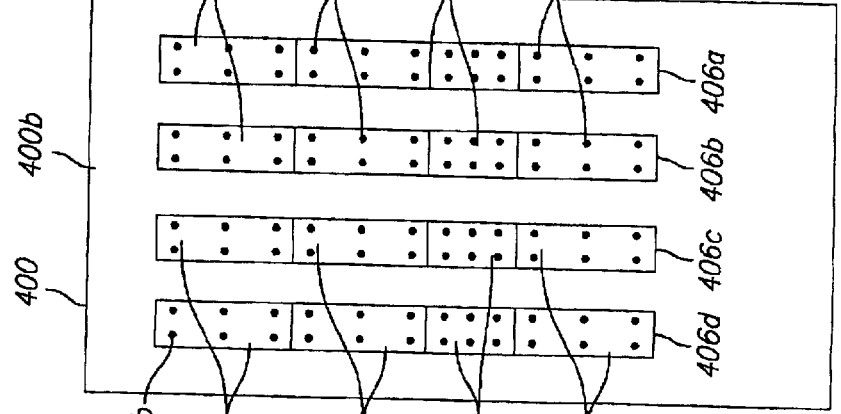
FIG. 4(b) shows a back view of a conventional CPCI backplane in the 6U form factor.
Figure 4A:
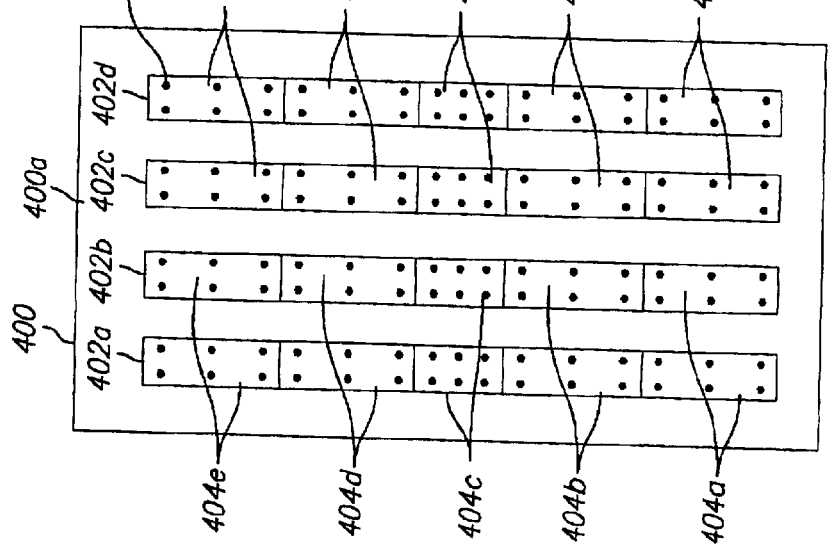
FIG. 4(a) shows a front view of a conventional CPCI backplane in the 6U form factor.

Referring to FIGS. 4(a) and 4(b), there are shown a front and back view of a conventional CPCI backplane in the 6U form factor, respectively. In FIG. 4(a), four slots 402a–402d are provided on the front side 400a of the backplane 400. In FIG. 4(b), four slots 406a–406d are provided on the back side 400b of the backplane 400. Note that in both FIGS. 4(a) and 4(b) only four slots are provided instead of eight slots as in FIG. 3. Further, it is important to note that each of the slots 402a–402d on the front side 400a has five connectors 404a–404e, while each of the slots 406a–406d on the back side 400b has only four connectors 408b–408e. This is because, as in the 3U form factor of the conventional CPCI system, the 404a connectors are provided for 32-bit PCI and connector keying. Thus, they do not have I/O connectors to their rear. Accordingly, the front cards that are inserted in the front side slots 402a–402d only transmit signals to the rear transition cards that are inserted in the back side slots 406a–406d through front side connectors 404b–404e.

Figure 5:
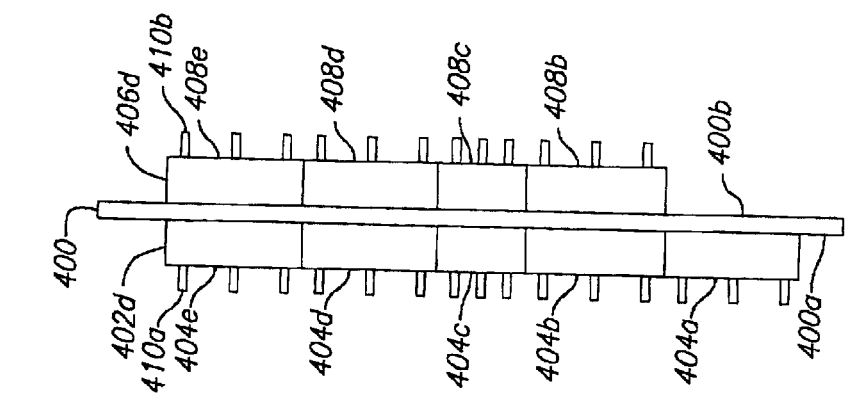
FIG. 5 shows a side view of the conventional backplane of FIGS. 4(a) and 4(b)

Referring to FIG. 5, there is shown a side view of the conventional backplane of FIGS. 4(a) and 4(b). As shown in FIG. 5, slot 402d on the front side 400a and slot 406d on the back side 400b are arranged to be substantially aligned so as to be back-to-back. Further, slot 402c on the front side 400a and slot 406c on the back side 400b are arranged to be substantially aligned, and so on. Accordingly, the front side connectors 404b–404e are arranged back-to-back with the back side connectors 408b–408e. Note that the front side connector 404a does not have a corresponding back side connector.

It is important to note that the system slot 402a is adapted to receive the CPU front card, and the signals from the system slot 402a are then transmitted to corresponding connector pins of the peripheral slots 402b–402d. Thus, the conventional CPCI system can have expanded I/O functionality by adding peripheral front cards in the peripheral slots 402b–402d.

Figure 6:
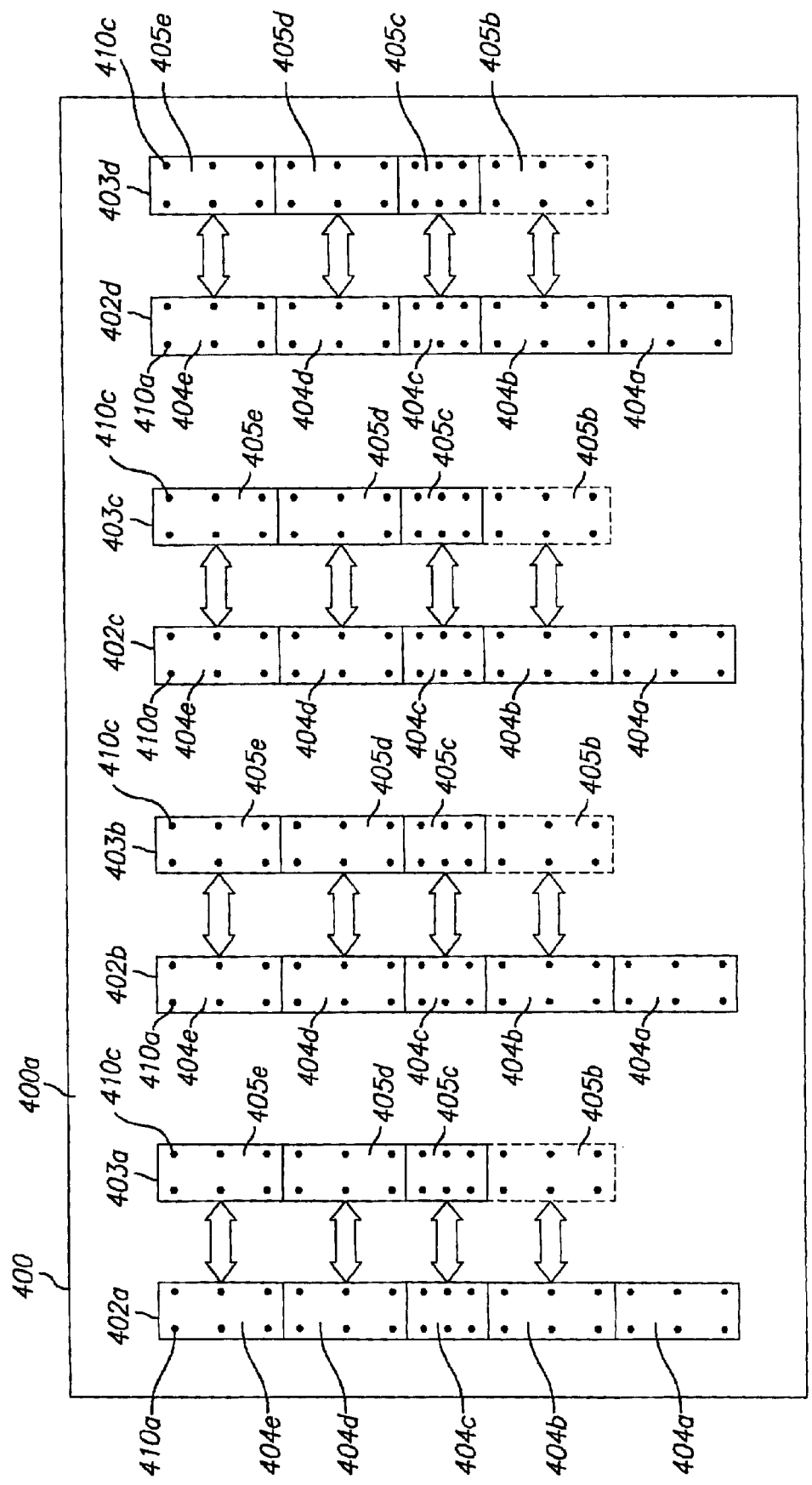
FIG. 6 is a front view of a customized CPCI backplane according to a preferred embodiment of the invention.

Referring to FIG. 6, there is shown a front view of a CPCI backplane 400 according to a preferred embodiment of the invention. Unlike conventional backplanes, backplane 400 is comprised of an additional set of CPCI card slots 403a–403d respectively adjacent to CPCI card slots 402a–402d. As illustrated, CPCI card slots 403a–403d are each further comprised of connectors 405b–405e. In a preferred embodiment, individual connector pins 410a within CPCI card slots 402a–402d are respectively connected to appropriate connector pins 410c within adjacent CPCI card slots 403a–403d. In particular, individual connector pins 410a corresponding to connectors 404b–404e are respectively connected to appropriate connector pins 410c within connectors 405b–405e.

Within such embodiment, "active" daughter card(s) ("front cards") are inserted into CPCI card slots 402a–402d while "passive" input/output (I/O) card(s) ("rear transition cards") are inserted into CPCI card slots 403a–403d. Furthermore, it should be appreciated that individual signals corresponding to "active" daughter card(s) inserted into CPCI card slots 402a–402d "pass-through" hardwire connections implemented within backplane 400 and connect to appropriate signals respectively corresponding to "passive" input/output (I/O) card(s) inserted into adjacent CPCI card slots 403a–403d. As a result, "passive" input/output (I/O) card(s) may be inserted into the front side of backplane 400 with their relevant signals being directly routed to relevant signals corresponding to adjacent "active" daughter card(s).

It should be appreciated that backplane 400 may be designed to accept 3U and 6U daughter card sizes. As is commonly practiced in the art, the use of 3U card sizes in conventional backplanes requires individual active cards to mate with front side connectors 404a and 404b. Meanwhile, passive cards are required to individually mate with rear connectors 405b located in the rear CPCI slot corresponding to the appropriate active card loaded on the front side 400a. Within this architecture, a 32-bit data bus internally provided by the CPCI system connects directly to all inserted active cards via connectors 404a. All remaining active card signals are then respectively passed through connectors 404b to their corresponding connections in passive cards inserted into appropriate rear connectors 405b.

For 6U daughter card sizes, however, it should be appreciated that active cards are individually inserted into front slots 402a–402d where they mate with connectors 404a–404e. Meanwhile, passive cards are inserted into rear slots 406a–406d where they mate with connectors 405c–405e. In this architecture, a 64-bit data bus provided by the CPCI system connects directly to all inserted active cards via connectors 404a and 404b. All remaining active card signals are then respectively passed through connectors 404c–404e to their corresponding connections in passive cards inserted into appropriate rear connectors 405c–405e.

In an alternative embodiment, active card signals pass through to their corresponding connections in passive cards via printed circuit (PC) boards herein referred to as shunt cards. Within this embodiment, shunt cards are connected to the rear side 400b of conventional backplanes 400 in order to "shunt" corresponding adjacent front slots. In particular, this shunt card implementation creates an active/passive front slot pair according to the pair of adjacent slots connected to the shunt card in the rear side 400b. In FIG. 7, a schematic of a shunt card is shown according to this particular embodiment. As illustrated, these shunt cards 420 are shown to be comprised of female connectors 428b–428e that are further comprised of a plurality of jacks 410d. Within this embodiment, appropriate connector pins 410b corresponding to adjacent slots are connected by inserting shunt card(s) 420 to the rear side 400b of backplane 400. In particular, these connections are made by mating connector pins 410b with jacks 410d.

Referring to FIG. 8, an exemplary implementation of a shunt card 420 is provided. In this particular example, shunt card 420 is used in order to "shunt" adjacent slots 406d and 406c on the rear side 400b of backplane 400. More specifically, shunt card 420 is used in order to respectively connect front card signals in connectors 408b–408e of slot 406d with their corresponding rear card signals in connectors 408b–408e of slot 406c. As a result, an active card and its related passive card may both be inserted from the front side 400a of backplane 400 using adjacent front side slots 402d and 402c. In this particular example, the operation of CPCI slots 402a and 402b remains the same as with conventional CPCI backplanes because their signals are not shunted. It should, however, be appreciated that shunt card 420 may be used to shunt any pair of adjacent slots in backplane 400. It should be further appreciated that similar embodiments may also include multiple shunt cards 420 used in order to shunt multiple sets of adjacent slots as well.

Similar to the previously described backplane 400, it should be appreciated that the shunt card 420 may be designed to accept 3U and 6U daughter card sizes. As illustrated in FIG. 8, shunt card 420 may accommodate three female connectors 428c–428e or four female connectors 428b–428e. Since front side connectors 404a and 404b are both reserved for communication between 6U active cards and the 64-bit data bus, only three female connectors 428c–428e are required for 6U daughter card sizes. For 3U card sizes, however, four female connectors 428b–428e are required because only connector 404a is needed to communicate with the 32-bit data bus. Moreover, since front loading 3U active cards are inserted into connectors 404a and 404b in conventional backplanes 400 and rear loading 3U passive cards are inserted only into connectors 408b, a female connector 428b is required in order to pass the appropriate 3U active card signals to their corresponding connections on the 3U passive card.

Having thus described a preferred embodiment of a front access only CPCI computer system, it should be apparent to those skilled in the art that certain advantages of the within system have been achieved. It should also be appreciated that various modifications, adaptations, and alternative embodiments thereof may be made within the scope and spirit of the present invention. The invention is further defined by the following claims.

What is claimed is:

1. A compact peripheral component interconnect (CPCI) computer system providing front-side access for both active and passive CPCI cards, the system comprising:
   an active backplane with a front and rear side; and
   a plurality of slots disposed for connecting to CPCI cards on one side of the backplane, each of the slots comprising connectors with individual electrical terminals arranged in columns, the connectors configured for connecting to mating connectors of the CPCI cards;
   wherein ones of the plurality of slots are arranged in at least one specially-connected pair comprising first and second ones of the connectors, wherein ones of the terminals in column-wise order from a rightmost column of the first ones of the connectors are connected to ones of the terminals in column-wise order from a leftmost column of the second ones of the connectors to provide at least one mirror-image pair of connectors on the one side of the backplane.

2. The system of claim 1, wherein the plurality of slots are located on the front side of the active backplane.

3. The system of claim 1, wherein the first and second ones of the connectors are adjacent.

4. The system of claim 1, further comprising a plurality of specially-connected pairs like the at least one specially-connected pair.

5. The system of claim 1, wherein ones of the terminals of the at least one specially-connected pair are connected within the active backplane.

6. The system of claim 1, wherein the first and second ones of the connectors of the at least one specially-connected pair are connected using a separate shunt.

7. The system of claim 6, wherein the shunt is mated with connectors facing from the rear side of the active backplane, while the first and second ones of the connectors face from the front side of the active backplane.

8. The system of claim 6, further comprising multiple shunts connected to multiple ones of the at least one specially-connected pair.

9. The system of claim 1, wherein the plurality of slots are each adapted to accept 3 U cards.

10. The system of claim 9, wherein two connectors in an active member of the pair of specially-connected slots are configured for active 3U cards.

11. The system of claim 9, wherein a single connector in a passive member of the pair of specially-connected slots is configured for passive 3U cards.

12. The system of claim 10, further comprising a 32-bit CPCI bus routed within the active backplane.

13. The system of claim 12, wherein one connector in the active member is configured to connect individual ones of the active cards to the 32-bit CPCI bus.

14. The system of claim 1, wherein the plurality of slots are each adapted to accept 6U cards.

15. The system of claim 14, wherein five connectors in an active member of the pair of specially-connected slots are configured for active 6U cards.

16. The system of claim 14, wherein three connectors in a passive member of the pair of specially-connected slots are configured for passive 3U cards.

17. The system of claim 15, further comprising a 64-bit CPCI bus routed within the active backplane.

18. The system of claim 17, wherein two connectors in the active member are configured to connect an active card to the 64-bit CPCI bus.

* * * * *